(12) United States Patent
Stoffels (10) Patent No.: US 10,686,052 B2
(45) Date of Patent: Jun. 16, 2020

(54) GATE FOR AN ENHANCEMENT-MODE TRANSISTOR

(71) Applicant: IMEC VZW, Leuven (BE)

(72) Inventor: Steve Stoffels, Haasrode (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 16/050,776

(22) Filed: Jul. 31, 2018

(65) Prior Publication Data

US 2019/0051732 A1 Feb. 14, 2019

(30) Foreign Application Priority Data

Aug. 11, 2017 (EP) .................................. 17186014

(51) Int. Cl.
*H01L 29/66* (2006.01)
*H01L 29/778* (2006.01)
(Continued)

(52) U.S. Cl.
CPC .... *H01L 29/66462* (2013.01); *H01L 21/0254* (2013.01); *H01L 21/02458* (2013.01);
(Continued)

(58) Field of Classification Search
CPC . H01L 29/778–7789; H01L 29/66446–66469; H01L 21/0254; H01L 21/02458
See application file for complete search history.

(56) References Cited

U.S. PATENT DOCUMENTS 7,576,373 B1 * 8/2009 Hikita ............... H01L 29/66462
257/192
7,714,350 B2 5/2010 Sugawara et al.
(Continued)

FOREIGN PATENT DOCUMENTS

JP 4806993 B2 11/2011

OTHER PUBLICATIONS

Lee, Finella et al., "Impact of Gate Metal on the Performance of p-GaN/AlGaN/GaN High Electron Mobility Transistors", IEEE Electron Device Letters, vol. 36, No. 3, Mar. 2015, pp. 232-234.
(Continued)

*Primary Examiner* — Stephen M Bradley
(74) *Attorney, Agent, or Firm* — McDonnell Boehnen Hulbert & Berghoff LLP (57) ABSTRACT

An enhancement-mode transistor and method for forming a gate of an enhancement-mode transistor are provided. The method includes: (a) providing a p-doped $Al_xGa_yIn_zN$ gate layer, consisting of a first part and a second part on top of the first part, above a p-doped $Al_xGa_yIn_zN$ channel layer of an enhancement-mode transistor under construction; and (b) providing a metal gate layer on the top surface of the second part, the metal gate layer being formed of a material such as to form a Schottky barrier with the second part, wherein providing the p-doped $Al_xGa_yIn_zN$ gate layer comprises the steps of: (a1) growing the first part above the p-doped $Al_xGa_yIn_zN$ channel layer of the enhancement-mode transistor under construction, the first part having an average Mg concentration of at most $3\times10^{19}$ atoms/cm$^3$, and (a2) growing the second part on the first part, the second part having an average Mg concentration higher than $3\times10^{19}$ atoms/cm$^3$ and having a top surface having a Mg concentration higher than $6\times10^{19}$ atoms/cm$^3$.

18 Claims, 2 Drawing Sheets

(51) Int. Cl.
*H01L 29/20* (2006.01)
*H01L 29/10* (2006.01)
*H01L 21/02* (2006.01)
*H01L 21/285* (2006.01)
*H01L 29/47* (2006.01)

(52) U.S. Cl.
CPC .. *H01L 21/02579* (2013.01); *H01L 21/28581* (2013.01); *H01L 29/1066* (2013.01); *H01L 29/2003* (2013.01); *H01L 29/47* (2013.01); *H01L 29/7786* (2013.01)

(56) References Cited

U.S. PATENT DOCUMENTS

| 8,431,960 | B2 | 4/2013 | Beach et al. | |
|---|---|---|---|---|
| 8,436,398 | B2 | 5/2013 | Lidow et al. | |
| 8,866,192 | B1* | 10/2014 | Chen | H01L 21/2652 |
| | | | | 257/194 |
| 2009/0121775 | A1* | 5/2009 | Ueda | H01L 29/739 |
| | | | | 327/427 |
| 2010/0258841 | A1* | 10/2010 | Lidow | H01L 29/1066 |
| | | | | 257/192 |
| 2011/0266554 | A1* | 11/2011 | Hikita | H01L 29/66462 |
| | | | | 257/76 |
| 2014/0264441 | A1* | 9/2014 | Murase | H01L 29/66462 |
| | | | | 257/190 |
| 2015/0340562 | A1* | 11/2015 | Kim | H01L 33/0075 |
| | | | | 257/76 |
| 2017/0133500 | A1 | 5/2017 | Etou et al. | |
| 2018/0331255 | A1* | 11/2018 | Grundmann | H01L 33/06 |

OTHER PUBLICATIONS

European Search Report, European Patent Application No. 17186014.1 dated Feb. 22, 2018, 10 pages.

Ohba, Y. et al., "A Study on Strong Memory Effects for Mg Doping in GaN Metalorganic Chemical Vapor Deposition", Journal of Crystal Growth, vol. 145, 1994, pp. 214-218.

Xing, Huili et al., "Memory Effect and Redistribution of Mg Into Sequentially Regrown GaN Layer by Metalorganic Chemical Vapor Deposition", The Japan Society of Applied Physics, vol. 42, Jan. 2003, pp. 50-53.

Kuech, T.F. et al., "The Control and Modeling of Doping Profiles and Transients in MOVPE Growth", Journal of Crystal Growth, vol. 93, 1988, pp. 624-630.

* cited by examiner

GATE FOR AN ENHANCEMENT-MODE TRANSISTOR

CROSS-REFERENCE

This application claims priority from European patent application no. 17186014.1, filed Aug. 11, 2017, which is incorporated by reference in its entirety.

TECHNICAL FIELD OF THE DISCLOSURE

The present disclosure relates to the field of enhancement mode transistors. More particularly, the disclosure relates to a method for forming a gate in an enhancement mode transistor.

BACKGROUND OF THE DISCLOSURE

Semiconductor devices based on Gallium nitride (GaN) can support high voltages and carry a large current. This makes them promising candidates for power semiconductor devices aimed at high power/high-frequency applications. Devices manufactured for such applications exhibit high electron mobility and are referred to as high electron mobility transistors (HEMT), heterojunction field effect transistors (HFET), or modulation doped field effect transistors (MODFET). These types of devices are typically operated at high frequencies (e.g. 100 kHz-10 GHz) and can typically withstand high voltages, e.g., 100 Volts.

GaN HEMT devices typically include an AlGaN barrier layer adjacent to a GaN layer. The difference in the material in these two layers contributes to a conductive two-dimensional electron gas (2 DEG) region near the junction of the two layers and in the layer with the smaller band gap. This 2 DEG allows charge to flow through the device. This feature makes such devices depletion mode devices that are normally "on" when no bias is applied at the gate. Enhancement mode (e-mode, normally "off") devices, however, typically more desirable as they are safer and easier to control. An enhancement mode device requires a positive bias applied at the gate in order to conduct current.

For a GaN HEMT device to work as an enhancement mode device, however, the 2 DEG region must be depleted.

One of the solutions to achieve normally-off (e-mode) operation for GaN HEMT transistors is to employ a p-GaN layer, i.e. a positively doped GaN layer, in the gate region. The Fermi level in the p-GaN will be pulled towards the valence band, lifting up the band-diagram in the GaN channel region achieving the required e-mode operation. The disadvantage of this solution is that the p-GaN gate is a junction type of gate and can thus cause high gate leakage. A solution to lower the gate leakage is to employ a gate metal, which can form a Schottky barrier towards the p-GaN. In the cross section, shown in FIG. 1, the metal in the Schottky barrier is TiN. However, the leakage of the metal in the Schottky barrier is in large part determined by the active Mg concentration in the p-GaN layer, where a higher concentration leads to a higher gate leakage. This causes a trade-off between the threshold voltage and gate leakage because to achieve a high threshold voltage, a high active Mg concentration is generally needed. However, high active Mg concentration also leads to increased leakage.

US2010/0258841 relates to enhancement mode GaN transistors and deals with the problem of high gate leakage when the transistor is turned on by applying a positive voltage to the gate contact. US2010/0258841 remarks that during growth of the p-GaN layer, Mg atoms diffuse to the growth surface. Hence, when growth is terminated, a heavily doped layer exists at the surface and when a positive bias is applied to the gate contact, a large current is generated due to the high doping at the top of this layer. US2010/0258841 proposes to solve this current leakage problem by reducing the Mg concentration to about $10^{16}$ atoms per $cm^3$ near the gate contact, thereby allowing the formation of a Schottky barrier between the gate contact and the p-type GaN. In addition to reducing the Mg concentration near the gate contact, US2010/0258841 proposes to n-dope the p-GaN gate layer by adding Si atoms near the gate contact in order to further reduce the hole density. However, US2010/0258841 does not propose an experimental way enabling the reduction of the Mg concentration near the gate contact. In fact, it can be very difficult to achieve such a reduction because, due to the dynamics of the MOCVD growth, a surface peak Mg concentration will typically be present near the top. Furthermore, Si counter-doping is not a solution since it requires matching exactly the Mg concentration and requires, therefore, full counter doping. Indeed, if the counter-doping is incomplete, gate leakage is to be expected and if the counter-doping is excessive, it will create highly doped n-layer near the top of the device.

There is, therefore, a need in the art for new ways to deal with the problem of high gate leakage.

SUMMARY OF THE DISCLOSURE

It is an object of the present disclosure to provide a method for forming a gate of an enhancement-mode transistor presenting limited gate leakage. It is a further object of the present disclosure to provide enhancement-mode transistors comprising such a gate.

It is an advantage of embodiments of the present disclosure that a depletion region can be formed at the interface with the metal gate layer, thereby enabling the formation of a Schottky barrier.

It is an advantage of embodiments of the present disclosure that the depletion region can be relatively uniform.

It is an advantage of embodiments of the present disclosure that the extent of the depletion region and its hole concentration can be easily controlled.

It is an advantage of embodiments of the present disclosure that the hole concentration in the depletion region can be relatively easily set at any value.

The above objective is accomplished by a method and device according to the present disclosure.

In a first aspect, the present disclosure relates to a method for forming a gate of an enhancement-mode transistor, the method comprising the steps of:
  a. providing a p-doped $Al_xGa_yIn_zN$ gate layer, consisting of a first part and a second part on top of the first part, above a $Al_{x'}Ga_{y'}In_{z'}N$ channel layer of an enhancement-mode transistor under construction wherein x+y+z is 1 and wherein x'+y'+z' is 1, and
  b. providing a metal gate layer on the top surface of the second part of the p-doped $Al_xGa_yIn_zN$ gate layer, the metal gate layer being formed of a material that forms a Schottky barrier with the second part of the p-doped $Al_xGa_yIn_zN$ gate layer,
wherein providing the p-doped $Al_xGa_yIn_zN$ gate layer comprises the steps of:
  a1. growing the first part of the p-doped $Al_xGa_yIn_zN$ gate layer until the first part reaches a thickness of at least 3 nm, above the $Al_{x'}Ga_{y'}In_{z'}N$ channel layer of the enhancement-mode transistor under construction, the first part having an average Mg concentration of at most $3 \times 10^{19}$ atoms/cm$^3$, and a2. growing the second part of the p-doped Al$_x$Ga$_y$In$_z$N gate layer, the second part having an average Mg concentration higher than $3 \times 10^{19}$ atoms/cm$^3$ and having a top surface having a Mg concentration higher than $6 \times 10^{19}$ atoms/cm$^3$, on the first part of the p-doped Al$_x$Ga$_y$In$_z$N gate layer.

In a second aspect, the present disclosure relates to an enhancement-mode transistor comprising a gate obtainable by the method of the first aspect. In particular, it relates to an enhancement-mode transistor comprising:

a. a p-doped Al$_x$Ga$_y$In$_z$N gate layer, consisting of a first part and a second part on top of the first part, above an Al$_{x'}$Ga$_{y'}$In$_{z'}$N channel layer, wherein x+y+z is 1 and x'+y'+z' is 1, and b. a metal gate layer on the top surface of the second part of the p-doped Al$_x$Ga$_y$In$_z$N gate layer, the metal gate layer being formed of a material that forms a Schottky barrier with the second part of the p-doped Al$_x$Ga$_y$In$_z$N gate layer, wherein the first part of the p-doped Al$_x$Ga$_y$In$_z$N gate layer has an average Mg concentration of at most $3 \times 10^{19}$ atoms/cm$^3$ and wherein the second part of the p-doped Al$_x$Ga$_y$In$_z$N gate layer, on the first part and in physical contact with the metal gate layer, has an average Mg concentration higher than $3 \times 10^{19}$ atoms/cm$^3$ and a top surface having a Mg concentration higher than $6 \times 10^{19}$ atoms/cm$^3$.

Particular aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

DESCRIPTION OF ILLUSTRATIVE EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the disclosure, various features of the disclosure are sometimes grouped together in a single embodiment, figure, or description thereof for the purpose of steamlining the disclosure and aiding in the understanding of one or more of the various disclosure aspects. This method of disclosure, however, is not to be interpreted as reflecting an intention that the claimed disclosure requires more features than are expressly recited in each claim. Rather, as the following claims reflect, disclosure aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures, and techniques have not been shown in detail in order not to obscure an understanding of this description.

The following terms are provided solely to aid in the understanding of the disclosure.

Mg concentrations in atoms/cm$^3$ can be measured by Secondary Ion Mass Spectrometry (SIMS).

The disclosure will now be described by a detailed description of several embodiments of the disclosure. It is clear that other embodiments of the disclosure can be configured according to the knowledge of persons skilled in the art without departing from the technical teaching of the disclosure, the disclosure being limited only by the terms of the appended claims.

Reference will be made to transistors. These are devices having a first main electrode such as a drain, a second main electrode such as a source and a control electrode such as a gate for controlling the flow of electrical charges between the first and second main electrodes.

Without being bound by any theory of operation, it is believed that the disclosure works via a self-compensation effect occurring when the Mg concentration passes a certain threshold concentration. This threshold concentration can be about $3\times10^{19}$ atoms/cm$^3$. Below that threshold, an increase in Mg concentration in the p-GaN layer can translate into an increase in hole concentration in that layer. Above that threshold, the hole concentration first stagnates and then drops rapidly once a value of at least $6\times10^{19}$ atoms/cm$^3$ is reached. In mechanistic terms, this effect can be explained by the fact that above the threshold, additional Mg atoms create point defects (Mg interstitials, nitrogen vacancies) which compensate the Mg already present, thereby reducing the hole concentration instead of increasing it. The present disclosure uses this property for going around the difficulties of achieving a controllable low Mg concentration in the p-GaN layer near the metal gate layer by counter-intuitively increasing the Mg concentration instead of decreasing it. The end result is a low hole concentration in the p-GaN layer close to the metal gate layer.

The first aspect of the present disclosure relates to a method for forming a gate of an enhancement-mode transistor. The gate comprises and typically consists of a p-doped $Al_xGa_yIn_zN$ gate layer with a metal gate layer thereon.

The p-doped $Al_xGa_yIn_zN$ gate layer may be an $Al_xGa_yIn_zN$ layer doped with Mg.

The p-doped $Al_xGa_yIn_zN$ gate layer consists of a first part and a second part on top of the first part. The second part may be grown epitaxially on top of the first part during either a continuous or a discontinuous growth process. The first part has an average Mg concentration of at most $3\times10^{19}$ atoms/cm$^3$ and the second part has an average Mg concentration higher than $3\times10^{19}$ atoms/cm$^3$ and has a top surface having a Mg concentration above $6\times10^{19}$ atom/cm$^3$.

In some embodiments, the average Mg concentration in the first part may be higher than $0.5\times10^{19}$, higher than $1\times10^{19}$ atoms/cm$^3$ or higher than $2\times10^{19}$ to allow a sufficiently high hole concentration to achieve a "normally off" mode. In one embodiment, the Mg concentration in the first part may be $3\times10^{19}$.

In embodiments, the second part of the p-doped $Al_xGa_yIn_zN$ gate layer may have an average Mg concentration higher than $4\times10^{19}$ atoms/cm$^3$. In one embodiment, the Mg concentration may be higher than $5\times10^{19}$ atoms/cm$^3$. This contributes to reducing the hole concentration in the second part, which helps reduce current leakage.

Typically, the Mg concentration may not be homogeneous across the thickness of each part as it tends to be higher at the growth front of the part than at higher depth in the part. The Mg concentration, therefore, tends to be higher near the top and lower near the bottom of the part.

In some embodiments, the Mg concentration at the top of the first part can be lower than $4\times10^{19}$ atoms/cm$^3$, lower than $3.5\times10^{19}$ atoms/cm$^3$ or at most $3\times10^{19}$ atoms/cm$^3$.

The Mg concentration at the bottom of the second part may be equal or higher than the Mg concentration at the top of the first part. It may be about equal or slightly higher if a continuous p-doped $Al_xGa_yIn_zN$ growth process is used and it may be higher if a discontinuous p-doped $Al_xGa_yIn_zN$ growth process is used and an interruption in the p-doped $Al_xGa_yIn_zN$ growth process may be used during Mg precursor flow without Ga, In, and Al precursor and/or without N precursor in the growth environment before resuming p-doped $Al_xGa_yIn_zN$ growth.

The Mg concentration at the top of the second part may be higher than $6\times10^{19}$ atoms/cm$^3$.

In embodiments, the top surface of the second part of the p-doped $Al_xGa_yIn_zN$ gate layer may have a Mg concentration higher than $7\times10^{19}$ atoms/cm$^3$ or higher than $7.5\times10^{19}$ atoms/cm$^3$. This contributes to drastically reducing the hole concentration in the second part, which helps reducing current leakage.

In embodiments, the first part of the p-doped $Al_xGa_yIn_zN$ gate layer may have a bottom surface, closest to the channel layer, having a Mg concentration lower than $2\times10^{19}$ atoms/cm$^3$.

In embodiments, the thickness of the first part may be from 10 to 60 nm. In embodiments, the thickness of the second part may be at least 20 nm or at least 30 nm. In one embodiment, the top 10 nm of the second part have an average Mg concentration above $6\times10^{19}$ atoms/cm$^3$.

Step (a) of forming the p-doped $Al_xGa_yIn_zN$ gate layer may be typically performed by chemical vapor deposition (CVD) and more precisely by metal organic chemical vapor deposition (MOCVD), i.e. a CVD method involving the use of one or more metalorganic precursors. Typically, all steps involving flowing a precursor gas are performed in presence of a carrier gas, e.g., a reductive gas mixture such as an $N_2/H_2$ gas mixture.

In the p-doped $Al_xGa_yIn_zN$ gate layer, the sum of x, y and z amount to 1. In embodiments, y amounts to at least 0.5, at least 0.8, or at least 0.9. In one embodiment, y equals 1.

The $Al_xGa_yIn_zN$ channel layer above which the p-doped $Al_xGa_yIn_zN$ gate layer may be formed and may also typically formed by chemical vapor deposition, on a substrate. Also, an $Al_{x''}Ga_{y''}In_{z''}N$ barrier layer, wherein x''+y''+y'' is 1, typically present between the $Al_xGa_yIn_zN$ channel layer and the p-doped $Al_xGa_yIn_zN$ gate layer may also typically formed by chemical vapor deposition. Hence, typically, the $Al_xGa_yIn_zN$ channel layer may be epitaxially grown on a substrate, the $Al_{x''}Ga_{y''}In_{z''}N$ barrier layer may be epitaxially grown on the $Al_xGa_yIn_zN$ channel layer, the first part of the p-doped $Al_xGa_yIn_zN$ gate layer may be epitaxially grown (typically on the $Al_{x''}Ga_{y''}In_{z''}N$ barrier layer), and the second part of the p-doped $Al_xGa_yIn_zN$ gate layer may be epitaxially grown on the first part of the p-doped $Al_xGa_yIn_zN$ layer.

In the $Al_xGa_yIn_zN$ channel layer, the sum of x', y' and z' amount to 1. In embodiments, y' amounts to at least 0.5, at least 0.8 or at least 0.9. In one embodiment, y' equals 1. In another embodiment, x=x', y=y' and z=z'.

The average Mg concentration in the channel layer can be less than $0.5 \times 10^{19}$ or less than $1 \times 10^{18}$ atoms/cm$^3$. In embodiments, the $Al_xGa_yIn_zN$ channel layer is not doped.

Typically, steps (a) and (b) may be both performed in a deposition chamber (e.g. a CVD deposition chamber), generally in the same deposition chamber. Steps (a1) and (a2) may be typically performed in the same deposition chamber.

In an embodiment of the method of the first aspect of the present disclosure, wherein step (a) is performed in a deposition chamber, step (a2) may comprise
  (i) stopping the growth of the first part, then
  (ii) providing the chamber with a first flow of a Mg precursor gas and no flow of Ga, In, and Al precursor gases (i.e. without Ga precursor gases, without In precursor gases and without Al precursor gases) and/or no flow of N precursor gas, then
  (iii) without flushing the chamber from the Mg precursor contained therein, providing the chamber with a second flow of the Mg precursor gas, a flow of one or more precursor gases selected from Ga, In and Al precursor gases and a flow of the N precursor gas so as to grow the second part.

In embodiments, the flow of Ga equals at least 50%, at least 80% or 90%. In one embodiment, the flow of Ga equals 100% of the flow of one or more precursor gases selected from Ga, In and Al precursor gases.

This embodiment, where a discontinuous growth process can be performed comprising an interruption in the provision of N and/or Ga, In and Al precursors, can be advantageous because Mg concentration in the growing p-doped $Al_xGa_yIn_zN$ layer increases in general only very slowly in reaction to an increase in Mg flow. The interruption of the N and/or Ga, In and Al flows allows the amount of Mg in the chamber and on the top surface of the first part to build up before resuming growth of the p-doped $Al_xGa_yIn_zN$ gate layer, thereby permitting a more abrupt change from a relatively low Mg concentration in the first part of the p-doped $Al_xGa_yIn_zN$ gate layer to a relatively high Mg concentration in the second part of the p-doped $Al_xGa_yIn_zN$ gate layer.

Step (i) of stopping the growth of the first part typically consists in stopping the flow of Ga, In and Al and/or N precursor. For this purpose, at least one of the flow of Ga, In and Al precursor and the flow of N precursor can be stopped, usually all of them. In embodiments, steps (i) and (ii) can be combined by stopping the flow of Ga, In and Al precursors and/or N precursors while keeping a flow of Mg precursor, (e.g. the same flow or a higher flow). At the end of step (ii), the chamber contains Mg precursors in its atmosphere and typically on its walls. Step (iii) can be performed without flushing the chamber from these Mg precursors. Providing in step (iii) the flow of Mg precursor gas can in some embodiments can be performed by keeping or increasing the flow of Mg precursor provided in step (ii). In embodiments, the transition between steps (ii) and (iii) can, therefore, be achieved by providing a flow of one or more of Ga, In and Al precursors and N precursors while keeping or raising the flow of Mg precursor.

In embodiments, step (ii) may be performed in such a way as to saturate the atmosphere of the chamber with the Mg precursor. This can be advantageous because it contributes to incorporating as much Mg precursor as possible in the second part of the p-doped $Al_xGa_yIn_zN$ gate layer, which leads to a hole concentration in the second part which can be as low as possible.

The flow of each precursor during each step can be adapted to achieve the desired Mg concentrations.

Achieving any particular Mg concentration can be done by adapting the flow ratio between on one hand the flow of the Mg precursors and on another hand the flow of Al, Ga and In precursors so as to achieve the desired concentration.

For instance, achieving any particular Mg concentration can be done by adapting the flow of the Mg precursor so as to achieve the desired concentration.

The obtained Mg concentration profile for a particular selection of flows is apparatus, temperature and pressure dependent and can be straightforwardly determined by trial and error.

In embodiments, the flow of the Mg precursor gas in step (ii) of step (a2) may be higher than a flow of Mg precursor gas used to grow the first part in step (a1). This can be advantageous because it contributes to incorporating as much Mg precursor as possible in the second part of the p-doped $Al_xGa_yIn_zN$ gate layer, which leads to a hole concentration which suitably low.

In embodiments, step (ii) may be performed for from 5 to 15 seconds or 8 to 12 seconds. This is typically long enough to assure that the chamber is sufficiently rich in Mg to obtain a second part of the p-doped $Al_xGa_yIn_zN$ gate layer gate layer having an average Mg concentration higher than $3 \times 10^{19}$ atoms/cm$^3$ and having a top surface having a Mg concentration higher than $6 \times 10^{19}$ atoms/cm$^3$ while simultaneously not being so long as to unnecessarily lengthen the process. Longer periods are of course also working but are less advantageous.

In embodiments, step (a1) may be performed at any temperature permitting the growth of the first part of the p-doped $Al_xGa_yIn_zN$ gate layer. For instance, a temperature of from 900 to 1050° C. may be used.

In embodiments, step (ii) of step (a2) and optionally step (iii) of step (a2) may be performed at a temperature of from 900 to 1000° C. or from 930 to 970° C. Using a lower temperature for step (a2) than for step a1 can reduce the tendency of Mg to migrate in the first part during the formation of the second part.

In embodiments, step (a1) may be performed until the first part of the p-doped $Al_xGa_yIn_zN$ gate layer reaches a thickness of from 3 to 60, 5 to 60 or 10 to 60 nm. Having the first part in this thickness range can be advantageous as it can be sufficiently thick not to negatively impact the threshold voltage.

In embodiments, step (a2) may be performed until the second part of the p-doped $Al_xGa_yIn_zN$ gate layer reaches at least a thickness of 20 nm or at least 30 nm. Such a thickness of low hole concentration p-doped $Al_xGa_yIn_zN$ close to the gate metal can contribute to a good Schottky barrier and a low leakage current.

In step (b), the material of the metal gate layer is such that a Schottky barrier with the second part of the p-doped $Al_xGa_yIn_zN$ gate layer can be formed. This is typically performed by selecting the material composing the metal gate layer in such a way that at equilibrium its Fermi level lies in the band gap of the second part of the p-doped $Al_xGa_yIn_zN$ gate layer but above its valence band edge.

The Mg precursor can be any precursor, or a combination thereof, known to the skilled person for doping an $Al_xGa_yIn_zN$ layer during CVD. For instance, it can be bis-cyclopentadienyl magnesium (CpMg).

The N precursor can be any N precursor, or a combination thereof, known to the skilled person for forming an $Al_xGa_yIn_zN$ layer. For instance, it can be $NH_3$, phenyl hydrazine, dimethylhydrazine, or tert-butylamine.

The Ga precursor can be any Ga precursor, or a combination thereof, known to the skilled person for forming an $Al_xGa_yIn_zN$ layer. For instance, it can be trimethylgallium or triethylgallium.

In embodiments, the method may further comprise providing an $Al_{x'}Ga_{y''}In_{z''}N$ barrier layer on the $Al_xGa_yIn_zN$ channel layer, wherein the p-doped $Al_xGa_yIn_zN$ gate layer is provided above and for instance on the $Al_{x''}Ga_{y''}In_{z''}N$ barrier layer, wherein x"+y"+z" is 1. The barrier layer typically can be a layer having a larger band gap than the channel layer. In embodiments where the p-doped $Al_xGa_yIn_zN$ gate layer is provided above (but not on) the $Al_{x''}Ga_{y''}In_{z''}N$ barrier layer, more than one layer can be present between the $Al_xGa_yIn_zN$ channel layer and the p-doped $Al_xGa_yIn_zN$ gate layer. This plurality of layers situated between the channel layer and the gate layer may be collectively referred to as a barrier. This barrier comprises the barrier layer mentioned herein as its bottom layer. To achieve a larger bandgap, in embodiments, x" may be larger than x'. In one embodiment, x<x">x'. Indeed, increasing x" tends to increase the bandgap of the $Al_{x''}Ga_{y''}In_{z''}N$ barrier layer. Of less impact, the ratio y"/z" may be larger than the ratio y'/z'. In one embodiment, (y/z)<(y"/z")>(y'/z'). Indeed, the larger this ratio y"/z" is, the larger the bandgap for a same x".

In an embodiment, the polarization (spontaneous & piezoelectrical) of the barrier layer may be larger than the polarization of the channel. This is advantageous as it can promote the formation of a 2 DEG in the channel. To achieve a larger polarization, in embodiments, x" may be larger than x'. In one embodiment, x<x">x'. Indeed, increasing x" tends to increase the polarization of the $Al_x"Ga_y"In_z"N$ barrier layer. Of less impact, the ratio z"/y" may be larger than the ratio z'/y'. In one embodiment, (z/y)<(z"/y")>(z'/y'). Indeed, the larger this ratio z"/y" is, the larger the bandgap for a same x".

Since the bandgap can be most efficiently increased by increasing x" over y" and by increasing y" over z" and since the polarization can be most efficiently increased by increasing x" over z" and by increasing z" over y", x<x">x' can advantageous for both increasing bandgap and for increasing polarization. On another hand, whether the ratio y"/z" can be better increased or decreased in the barrier compared to the channel material will depend on the relative need for an increased band gap and an increased polarization in the device under construction.

In some embodiments, x and x'=0 and x" can be larger than 0. In other embodiments, x=x'=z=z'=z"=0 and x" is larger than 0, from 0.15 to 0.30, or from 0.20 to 0.25.

In embodiments, the lattice constants of the p-doped gate layer may match the lattice constant of the channel layer. In one embodiment, the lattice constants of the p-doped gate layer may match the lattice constant of the barrier layer. In another embodiment, the lattice constants of the p-doped gate layer may match the lattice constant of the channel layer and the barrier layer. In other embodiments, the lattice constant of the channel layer may be different from the lattice constant of the barrier layer in order to induce strain in the channel layer.

Suitable Al precursors for the formation of the barrier layer can include, for instance, trimethylaluminum (TMAl), triethylaluminum (TEAl). The nitrogen precursor and the gallium precursor can be, for instance, as described above.

In a second aspect, the present disclosure relates to an enhancement-mode transistor comprising a gate obtainable by the method of the first aspect. In particular, it relates to an enhancement-mode transistor comprising:

a. a p-doped $Al_xGa_yIn_zN$ gate layer, consisting of a first part and a second part on top of one another, above an $Al_{x'}Ga_{y'}In_{z'}N$ channel layer, wherein x+y+z is 1 and x'+y'+z' is 1, and b. a metal gate layer on the top surface of the second part of the p-doped $Al_xGa_yIn_zN$ gate layer, the metal gate layer being formed of a material such as to form a Schottky barrier with the second part of the p-doped $Al_xGa_yIn_zN$ gate layer, wherein the first part of the p-doped $Al_xGa_yIn_zN$ gate layer has an average Mg concentration of at most $3\times10^{19}$ atoms/cm$^3$ and wherein the second part of the p-doped $Al_xGa_yIn_zN$ gate layer, on the first part and in physical contact with the metal gate layer, has an average Mg concentration higher than $3\times10^{19}$ atoms/cm$^3$ and a top surface having a Mg concentration higher than $6\times10^{19}$ atoms/cm$^3$.

Any feature of the second aspect can be as described for corresponding features of the first aspect as discussed above.

Figure 2:
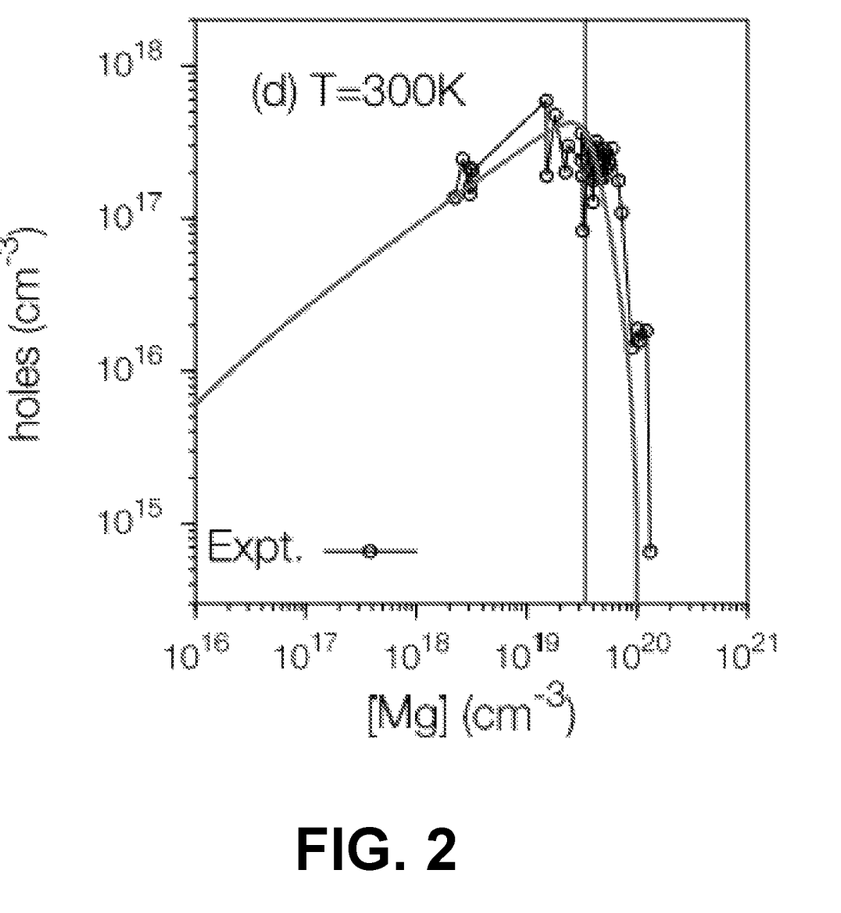
FIG. 2 is a graph of the hole concentration versus the Mg concentration in a p-GaN as known from the prior art.

FIG. 2 is a graph of the hole concentration versus the Mg concentration in a p-GaN at 300K as known from the prior art. The experimental points are the hollow circles. They are joined by a broken line. A theoretical line is superimposed on the experimental results. As can be seen, above a certain Mg concentration, the hole concentration starts to drop. This observation has been exploited in embodiments of the present disclosure to reduce the hole concentration in the second part of the p-GaN gate layer.

Figure 3:
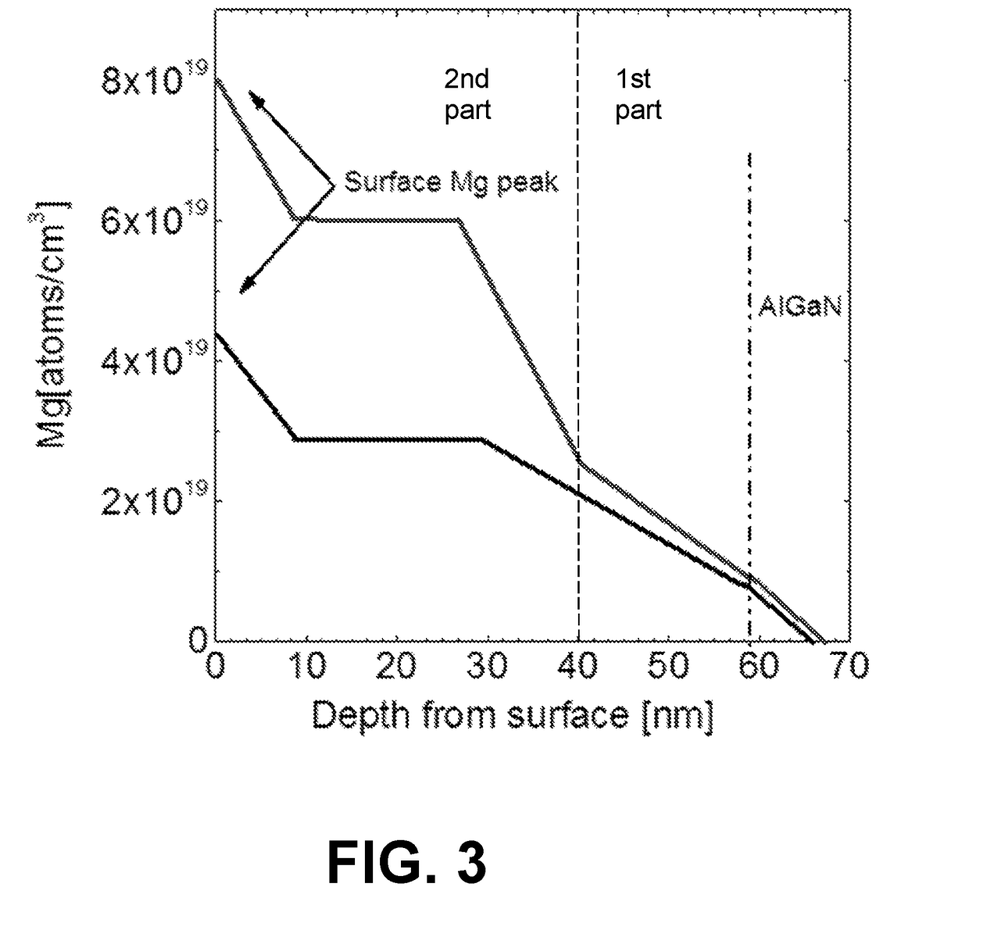
FIG. 3 is a schematic representation of a typical Mg concentration profile obtainable in the prior art (bottom) and in a representative enhancement-mode GaN transistor obtainable by a method according to an embodiment of the present disclosure (top).

FIG. 3 is a schematic representation of a typical Mg concentration profile obtainable in the prior art (bottom) and in an enhancement-mode GaN transistor obtainable by a method according to an embodiment of the present disclosure (top). As can be seen, the present disclosure counterintuitively aims at much higher Mg concentration close to the surface of the p-GaN gate layer than conventional methods. The dashed line separates the first and the second part of the p-GaN gate layer. Although the exact position of this separation is not crucial, the top surface of the second part generally has a Mg concentration above $6\times10^{19}$ atoms/cm$^3$ (hence the second part encompasses the depth 0); has an average concentration of above $3\times10^{19}$ atoms/cm$^3$; and has a first part (2a) with an average Mg concentration of at most $3\times10^{19}$ atoms/cm$^3$ and a thickness of at least 3 nm.

Figure 1:
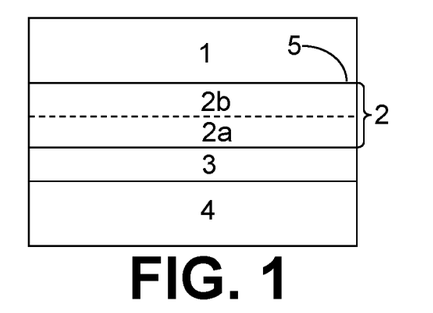
FIG. 1 is a schematic representation of a cross-section of a stack of layers comprised in representative enhancement-mode GaN transistor obtained by a method according to an embodiment of the present disclosure.

Example 1: Method for Forming a Gate of a Representative Enhancement-Mode GaN Transistor Involving the Continuous Growth of a p-GaN Layer Via Two Successive Different Cp2Mg Flow Referring to FIG. 1, an enhancement-mode GaN transistor under construction was provided in a Chemical Vapor Deposition chamber. It comprised a GaN channel layer (4) and an AlGaN barrier layer (3) thereon. A p-GaN layer (2) was then epitaxially grown on the AlGaN barrier layer (3) as follows. The chamber was set at a pressure of 200 torr and a temperature of 1010° C. 64 standard liter per minute (slm) $N_2$ and 120 slm $H_2$ flowed in the chamber as ambient gases. Then, for a period of 192 seconds, 50 slm $NH_3$, 92 standard cubic centimeters per minute (sccm) trimethylgallium (TMGa), and 500 sccm bis(cyclopentadienyl)magnesium (Cp2Mg) flowed through the chamber, in addition to the $N_2$ and $H_2$ gases, leading to the formation of a first 40 nm thick Mg-doped GaN layer (2a). This first p-GaN layer (2a) had a relatively low Mg concentration. Then, without interruption, the Cp2Mg flow was raised to 750 sccm for a second period of 384 seconds while maintaining the $NH_3$ at its current value but decreasing the TMGa flow to 46 sccm, leading to the formation of a second 40 nm thick Mg-doped GaN layer (2b) epitaxially grown on top of the first p-GaN layer (2a). This second p-GaN layer (2b) had a Mg concentration which is so high that it decreases the hole density in the p-GaN layer. A TiN layer (1) is then deposited on the second p-GaN layer (2b), thereby forming a Schottky barrier with the second p-GaN layer (2b). FIG. 1 shows the top surface (5) of the second p-GaN layer (2b) where the highest Mg concentration is present.

Example 2, Method for Forming a Gate of a Representative Enhancement-Mode GaN Transistor Involving the Discontinuous Growth of a p-GaN Layer Comprising a First p-GaN Growth Step, an Interruption where Only a Cp2Mg Flow is Present, and a Second p-GaN Growth Step This example gives an alternative way to form a gate according to embodiments of the present disclosure, referencing FIG. 1. An enhancement-mode GaN transistor under construction was provided in a chamber. It comprised a GaN channel layer (4) and an AlGaN barrier layer (3) thereon. A p-GaN layer (2) was then epitaxially grown on the AlGaN barrier layer (3) as follows. The chamber was set at a pressure of 200 torr and a temperature of 1010° C. 64 standard liter per minute (slm) $N_2$ and 120 slm $H_2$ flowed in the chamber as ambient gases. Then, for a period of 192 seconds, 50 slm $NH_3$, 92 sccm TMGa, and 500 sccm Cp2Mg flowed through the chamber in addition to the $N_2$ and $H_2$ gases, leading to the formation of a first 40 nm thick Mg-doped GaN layer (2a). This first p-GaN layer (2a) had a relatively low Mg concentration. Then, $NH_3$ and TMGa flows were interrupted for a period of 10 seconds during which the Cp2Mg flow was raised to 750 sccm. Next, a second p-GaN growth period of 384 seconds was performed by maintaining the Cp2Mg flow at 750 sccm and by resuming a 50 slm $NH_3$ flow and a 46 TMGa flow, leading to the formation of a second p-GaN layer (2b), 40 nm thick, epitaxially grown on top of the first p-GaN layer (2a). This second p-GaN layer (2b) had a Mg concentration which was so high that it decreased the hole density in the p-GaN layer (2). A TiN layer (1) was then deposited on the second p-GaN layer, thereby forming a Schottky barrier with the second p-GaN layer.

It is to be understood that although embodiments, specific constructions and configurations, as well as materials, have been discussed herein for devices according to the present disclosure, various changes or modifications in form and detail may be made without departing from the scope of this disclosure. For example, any formulas given above are merely representative of procedures that may be used. Steps may be added or deleted to methods described within the scope of the present disclosure.

The invention claimed is:

1. A method for forming a gate of an enhancement-mode transistor, the method comprising the steps of:
   (a) providing a p-doped $Al_xGa_yIn_zN$ gate layer, consisting of a first part and a second part on top of the first part, above a $Al_xGa_yIn_zN$ channel layer of an enhancement-mode transistor under construction wherein $x+y+z$ is 1 and wherein $x'+y'+z'$ is 1; and
   (b) providing a metal gate layer on a top surface of the second part of the p-doped $Al_xGa_yIn_zN$ gate layer, the metal gate layer being formed of a material such as to form a Schottky barrier with the second part of the p-doped $Al_xGa_yIn_zN$ gate layer,
   wherein providing the p-doped $Al_xGa_yIn_zN$ gate layer comprises the steps of:
   (a1) growing the first part of the p-doped $Al_xGa_yIn_zN$ gate layer until the first part reaches a thickness of at least 3 nm, above the $Al_xGa_yIn_zN$ channel layer of the enhancement-mode transistor under construction, the first part having an average Mg concentration of at most $3\times10^{19}$ atoms/cm$^3$; and
   (a2) growing the second part of the p-doped $Al_xGa_yIn_zN$ gate layer on the first part of the p-doped $Al_xGa_yIn_zN$ gate layer, the second part having an average Mg concentration higher than $3\times10^{19}$ atoms/cm$^3$ and a Mg concentration higher than $6\times10^{19}$ atoms/cm$^3$ on the top surface of the second part,
   wherein step (a) is performed in a deposition chamber; and
   wherein step (a2) comprises
   (i) stopping the growth of the first part; then
   (ii) providing the chamber with a first flow of a Mg precursor gas and no flow of Ga, In, and Al precursor gases and/or no flow of N precursor gas; then
   (iii) without flushing the chamber from the Mg precursor contained therein, providing the chamber with a second flow of the Mg precursor gas, a flow of one or more precursor gases selected from Ga, In, and Al precursor gases and a flow of the N precursor gas so as to grow the second part.

2. The method according to claim 1, wherein step (a) is performed by chemical vapor deposition.

3. The method according to claim 1, wherein step (ii) is performed in such a way as to saturate an atmosphere of the chamber with the Mg precursor gas.

4. The method according to claim 1, wherein the second flow of the Mg precursor gas in step (ii) of step (a2) is higher than the first flow of the Mg precursor gas used to grow the first part in step (a1).

5. The method according to claim 1, wherein step (ii) is performed for a time period ranging from 5 to 15 seconds.

6. The method according to claim 1, wherein step (ii) is performed for a time period ranging from 8 to 12 seconds.

7. The method according to claim 1, wherein step (ii) and optionally step (iii) are performed at a temperature ranging from 900 to 1000° C.

8. The method according to claim 1, wherein step (ii) is performed at a temperature ranging from 930 to 970° C.

9. The method according to claim 1, wherein step (a1) is performed until the first part of the p-doped $Al_xGa_yIn_2N$ gate layer reaches a thickness of from 10 to 60 nm.

10. The method according to claim 1, wherein the Mg concentration at a bottom of the first part, away from the second part, is lower than the Mg concentration at a top of the first part and at an interface with the second part.

11. The method according to claim 1, further comprising providing an $Al_{x''}Ga_{y''}In_{z''}N$ barrier layer on the $Al_{x'}Ga_{y'}In_{z'}N$ channel layer, wherein the p-doped $Al_xGa_yIn_zN$ gate layer is provided on the $Al_{x''}Ga_{y''}In_{z''}N$ barrier layer, wherein $x''+y''+z''$ is 1, and wherein $x<x''>x'$.

12. The method according to claim 1, wherein the second part of the p-doped $Al_xGa_yIn_zN$ gate layer has an average Mg concentration higher than $4\times10^{19}$ atoms/cm$^3$.

13. The method according to claim 1, wherein the second part of the p-doped $Al_xGa_yIn_zN$ gate layer has an average Mg concentration higher than $5\times10^{19}$ atoms/cm$^3$.

14. The method according to claim 1, wherein the top surface of the second part of the p-doped $Al_xGa_yIn_zN$ gate layer has a Mg concentration higher than $7\times10^{19}$ atoms/cm$^3$.

15. The method according to claim 1, wherein the top surface of the second part of the p-doped $Al_xGa_yIn_zN$ gate layer has a Mg concentration higher than $7.5\times10^{19}$ atoms/cm$^3$.

16. The method according to claim 1, wherein the first part of the p-doped $Al_xGa_yIn_zN$ gate layer has a bottom surface closest to the channel layer, the bottom surface having a Mg concentration lower than $2\times10^{19}$ atoms/cm$^3$.

17. The method according to claim 1, wherein step (a2) is performed until the second part of the p-doped $Al_xGa_yIn_zN$ gate layer reaches a thickness of at least 20 nm.

18. The method according to claim 1, wherein step (a2) is performed until the second part of the p-doped $Al_xGa_yIn_zN$ gate layer reaches a thickness of at least 30 nm.

\* \* \* \* \*